(12) United States Patent
Goenawan et al.

(10) Patent No.: US 11,018,583 B2
(45) Date of Patent: May 25, 2021

(54) SWITCHING VOLTAGE REGULATORS WITH PHASE-LOCK LOOPS AND LOCK RANGE EXTENSION

(71) Applicant: KINETIC TECHNOLOGIES, San Jose, CA (US)

(72) Inventors: Sofjan Goenawan, Cupertino, CA (US); Jan Nilsson, Sunnyvale, CA (US); Brian North, Los Gatos, CA (US); Karl Richard Volk, Scotts Valley, CA (US)

(73) Assignee: Kinetic Technologies, San Jose, CA (US)

( * ) Notice: Subject to any disclaimer, the term of this patent is extended or adjusted under 35 U.S.C. 154(b) by 0 days.

(21) Appl. No.: 16/662,538

(22) Filed: Oct. 24, 2019

(65) Prior Publication Data

US 2021/0126533 A1 Apr. 29, 2021

(51) Int. Cl.
| | | |
|---|---|---|
| *H02M 3/158* | (2006.01) | |
| *H02M 3/157* | (2006.01) | |
| *H02M 1/08* | (2006.01) | |
| *H03L 7/085* | (2006.01) | |

(52) U.S. Cl.
CPC ............. *H02M 3/158* (2013.01); *H02M 1/08* (2013.01); *H02M 3/157* (2013.01); *H03L 7/085* (2013.01)

(58) Field of Classification Search
CPC ....... H02M 3/156–158; H02M 3/1588; H02M 3/335; H02M 3/33515; H02M 3/143; H02M 1/08; H02M 1/44; H02M 2001/0012; H02M 5/00; H02M 7/155; H02M 7/04; H02P 11/00; H02J 1/10; G05F 1/00; G05F 1/10; G05F 3/16
See application file for complete search history.

(56) References Cited

U.S. PATENT DOCUMENTS

| | | | | |
|---|---|---|---|---|
| 7,009,372 B2 * | 3/2006 | Sutardja | ................ | H02M 1/088 |
| | | | | 323/283 |
| 7,622,820 B1 * | 11/2009 | Prodic | ................... | H02M 3/158 |
| | | | | 307/31 |
| 7,859,239 B2 * | 12/2010 | Yamada | .............. | H02M 3/1588 |
| | | | | 323/283 |
| 8,077,490 B1 * | 12/2011 | Prodic | ................... | H02M 3/157 |
| | | | | 363/65 |
| 9,281,745 B2 * | 3/2016 | Zoso | ...................... | H02M 3/157 |

(Continued)

OTHER PUBLICATIONS

PCT International Search Report and the Written Opinion dated Nov. 23, 2020, issued in related International Application No. PCT/US2020/057204 (6 pages).

*Primary Examiner* — Nguyen Tran
*Assistant Examiner* — Nusrat Quddus
(74) *Attorney, Agent, or Firm* — Sheppard Mullin Richter & Hampton LLP

(57) ABSTRACT

Adaptive on-time switching voltage regulator circuits and methods therefor provided. In some embodiments, a voltage regulator comprises: a switching circuit configured to generate a switching signal at a switching node according to a pulse-width modulated (PWM) signal; a phase-lock loop (PLL) configured to lock the PWM signal to a clock reference signal, the PLL comprising: a PWM signal generator configured to generate the PWM signal according to an error signal, and a phase detector configured to generate the error signal based on the PWM signal and the clock reference signal.

18 Claims, 7 Drawing Sheets

(56) References Cited

U.S. PATENT DOCUMENTS

| | | | | |
|---|---|---|---|---|
| 9,331,573 | B2* | 5/2016 | Yanagida | H02M 3/156 |
| 9,692,303 | B2* | 6/2017 | Morroni | H02M 3/158 |
| 10,218,366 | B1* | 2/2019 | Voegeli | H03L 7/18 |
| 10,418,898 | B2* | 9/2019 | Cho | H02M 1/08 |
| 2006/0152204 | A1* | 7/2006 | Maksimovic | H02M 3/1588 |
| | | | | 323/284 |
| 2008/0042632 | A1* | 2/2008 | Chapuis | H02M 3/157 |
| | | | | 323/283 |
| 2008/0303501 | A1* | 12/2008 | Prodic | H02M 3/157 |
| | | | | 323/283 |
| 2009/0079401 | A1* | 3/2009 | Mok | H02M 3/157 |
| | | | | 323/234 |
| 2009/0267582 | A1* | 10/2009 | Prodic | H02M 3/157 |
| | | | | 323/283 |
| 2012/0153917 | A1* | 6/2012 | Adell | H02M 3/1588 |
| | | | | 323/283 |
| 2013/0049723 | A1* | 2/2013 | Latham, II | H02M 3/157 |
| | | | | 323/282 |
| 2016/0336848 | A1* | 11/2016 | Meola | H02M 3/04 |

* cited by examiner

SWITCHING VOLTAGE REGULATORS WITH PHASE-LOCK LOOPS AND LOCK RANGE EXTENSION

TECHNICAL FIELD

This disclosure relates to generally to voltage regulators, and more specifically, relates to switching voltage regulators.

BACKGROUND

Adaptive on-time switching voltage regulators are widely employed in a variety of applications. However, due to process variations, the switching frequencies of these regulators may vary significantly. These process variations include the on-resistance of field-effect transistors, and comparator mismatch, offset, and speed. Variations in the switching frequencies of +1-25% are commonly observed.

SUMMARY

In general, one aspect disclosed features an adaptive on-time switching voltage regulator comprising: a switching circuit configured to generate a switching signal at a switching node according to a pulse-width modulated (PWM) signal; a phase-lock loop (PLL) configured to lock the PWM signal to a clock reference signal, the PLL comprising: a PWM signal generator configured to generate the PWM signal according to an error signal, and a phase detector configured to generate the error signal based on the PWM signal and the clock reference signal.

Embodiments of the switching voltage regulator may include one or more of the following features. In some embodiments, the phase detector is further configured to generate the error signal based on a phase difference between the PWM signal and a clock reference signal. In some embodiments, the switching circuit is further configured to set an on-time of the switching signal according to a pulse width of the PWM signal. Some embodiments comprise an inductor coupled between the switching node and an output node; and a capacitor coupled between the output node and ground. In some embodiments, the switching circuit comprises: a first switch coupled between a power input and the switching node; a second switch coupled between ground and the switching node; and a driver configured to operate the first and second switches according to the PWM signal. Some embodiments comprise a lock range extension circuit configured to generate an extension signal based on the PWM signal and the clock reference signal; wherein the PWM signal generator is further configured to generate the PWM signal according to the error signal and the extension signal. Some embodiments comprise a summer configured to generate a sum of the error signal and the extension signal; wherein the PWM signal generator is further configured to generate the PWM signal according to the sum of the error signal and the extension signal. In some embodiments, the lock range extension circuit comprises: a counter configured to store an extension value; a digital-to-analog converter configured to provide the extension signal based on the extension value stored in the counter; and a comparator circuit configured to modify the extension value based on a number of pulses of the PWM signal that occur over a predetermined number of cycles of the clock reference signal. In some embodiments, the comparator circuit comprises: a further counter configured to count pulses of the PWM signal over a predetermined number of clock cycles of the clock reference signal; and a comparator configured to modify the extension value based on counted pulses of the PWM signal and the predetermined number of cycles of the clock reference signal. In some embodiments, the comparator circuit further comprises: a pause circuit configured to pause operation of the comparator circuit for a determined number of cycles of the reference clock signal after occurrence of the predetermined number of clock cycles of the clock reference signal. In some embodiments, the comparator circuit further comprises: a clamp circuit configured to prevent rollover of the digital-to-analog converter.

In general, one aspect disclosed features a method for a switching voltage regulator, the method comprising: generating a switching signal at a switching node according to a pulse-width modulated (PWM) signal; and locking the PWM signal to a clock reference signal, comprising: generating the PWM signal according to an error signal, and generating the error signal based on the PWM signal and the clock reference signal.

Embodiments of the method may include one or more of the following features. Some embodiments comprise generating the error signal based on a phase difference between the PWM signal and a clock reference signal. Some embodiments comprise setting an on-time of the switching signal according to a pulse width of the PWM signal. Some embodiments comprise operating at least one switch according to the PWM signal. Some embodiments comprise generating an extension signal based on the PWM signal and the clock reference signal; and generating the PWM signal according to the error signal and the extension signal. Some embodiments comprise generating a sum of the error signal and the extension signal; and generating the PWM signal according to the sum of the error signal and the extension signal. Some embodiments comprise providing the extension signal based on an extension value; and modifying the extension value based on a number of pulses of the PWM signal that occur over a predetermined number of cycles of the clock reference signal. Some embodiments comprise counting pulses of the PWM signal over a predetermined number of clock cycles of the clock reference signal; and modifying the extension value based on counted pulses of the PWM signal and the predetermined number of cycles of the clock reference signal. Some embodiments comprise pausing operation of the comparator circuit for a determined number of cycles of the reference clock signal after occurrence of the predetermined number of clock cycles of the clock reference signal.

DETAILED DESCRIPTION

Embodiments of the present disclosure provide adaptive on-time switching voltage regulators with phase-lock loops (PLL). The disclosed regulators feature first-order PLLs that ensure the stability of the switching frequencies. Within a regulator, a signal generator generates an error signal that represents a phase difference between a reference clock signal and the pulse-width modulated signal used to operate the switches of the regulator. The disclosed PLLs may be implemented in any switching regulator that is based on hysteretic, constant on-time, adaptive on-time, and other technologies that do not use a clock signal to control either their on-time or off-time PWM signals.

In some embodiments, the disclosed PLLs may be implemented in adaptive on-time buck regulators. Exemplary adaptive on-time buck regulators are disclosed in US patent publication number 2019/0131873, filed Apr. 27, 2018, entitled "SYSTEMS AND METHODS FOR PROVIDING INTELLIGENT CONSTANT ON-TIME CONTROL," the disclosure thereof incorporated by reference herein in its entirety for all purposes.

Figure 1:
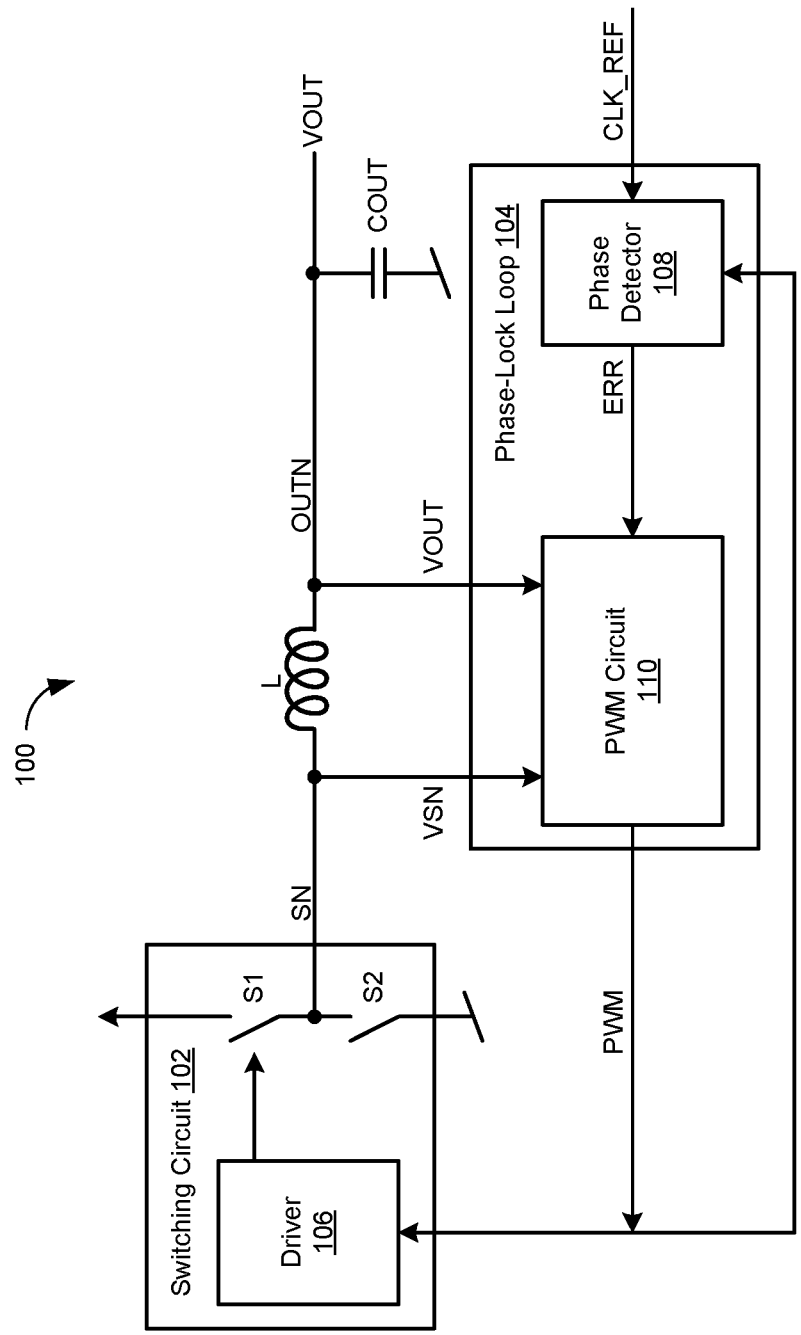
FIG. 1 illustrates a switching regulator according to embodiments of the present disclosure.

FIG. 1 illustrates a switching regulator 100 according to some embodiments of the present disclosure. Referring to FIG. 1, the regulator 100 may include a switching circuit 102. The switching circuit 102 may include a switch S1 coupled to a power input, and a switch S2 coupled to the switch S1 at a switching node SN. The switching circuit 102 may include a driver 106 that operates the switches S1 and S2 in accordance with a pulse-with modulated timing signal PWM.

The regulator 100 may include an inductor L coupled between the switching node SN and an output node OUTN of the regulator 100. The regulator 100 may include an output capacitor COUT coupled between the output node OUTN and ground. The regulator 100 may include a phase-lock loop (PLL) 104. The PLL 104 may include a PWM circuit 110 to generate the timing signal PWM in accordance with an error signal ERR. In some embodiments, the PWM circuit 110 may generate the timing signal PWM based on one or both of a voltage VSN of the switching node SN, and an output voltage VOUT of the output node OUTN.

The PLL 104 may include a phase detector 108 that generates the error signal ERR. The error signal ERR may represent a phase difference between a clock reference signal CLK_REF and the timing signal PWM.

The PLL 104 may lock the rising edge of the timing signal PWM to the rising edge of the clock reference signal CLK_REF. In this manner, the switching frequency of the regulator 100 may be locked to the frequency of the clock reference signal CLK_REF. Accordingly, the switching frequency of the regulator 100 may be set and maintained by setting the frequency of the clock reference signal CLK_REF.

Figure 2:
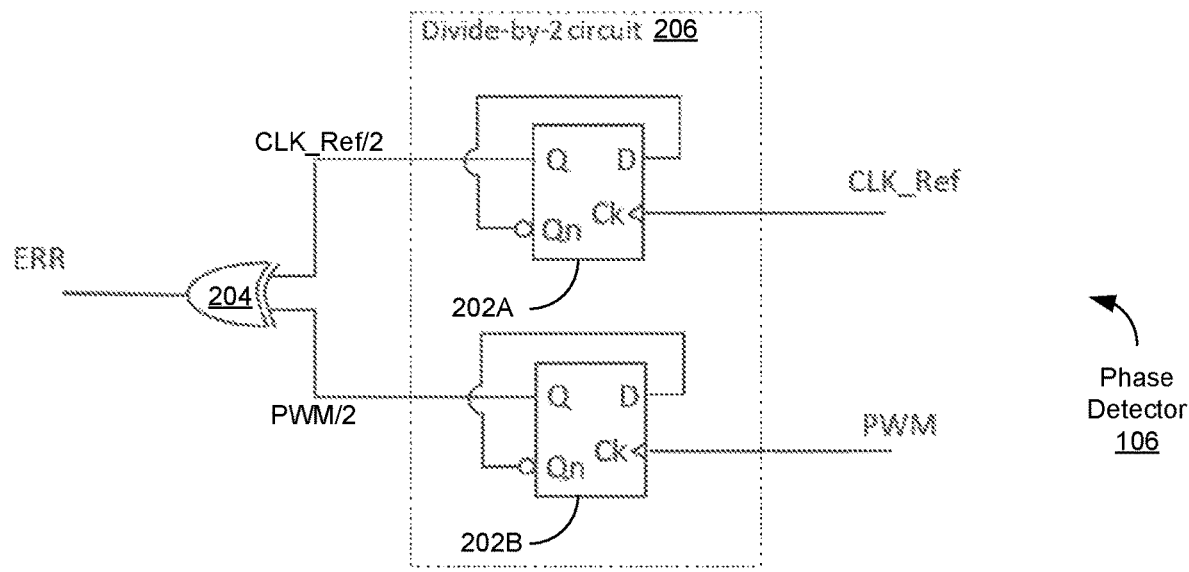
FIG. 2 illustrates detail of the phase detector of FIG. 1 according to embodiments of the present disclosure.
Figure 3:
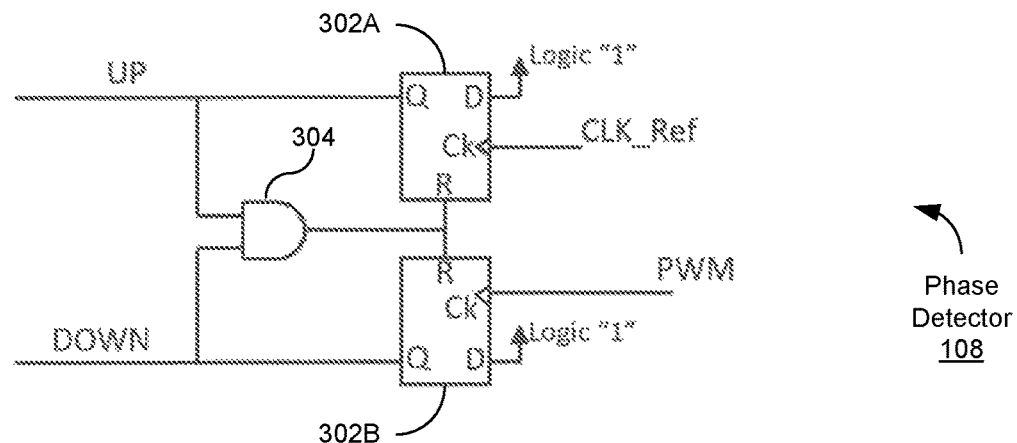
FIG. 3 illustrates detail of the phase detector of FIG. 1 according to embodiments of the present disclosure.

FIG. 2 illustrates detail of the phase detector 106 of FIG. 1 according to some embodiments of the present disclosure. Referring to FIG. 2, the phase detector 106 may include an exclusive-or gate 204, and a divide-by-two circuit 206. The divide-by-two circuit 206 may include two D flip-flops 202A and 202B. In some embodiments, the exclusive-or gate 204 is replaced by an exclusive-nor gate 204. Each of the flip-flops 202 may receive its inverted output Qn as its D input. The flip-flop 202A may be clocked by the clock reference signal CLK_REF, while the flip flop 202B may be clocked by the timing signal PWM. The Q output of the flip-flop 202A is a signal CLK_REF/2 that has a 50% duty cycle regardless of the duty cycle of the clock reference signal CLK_REF. The Q output of the flip-flop 202B is a signal PWM/2 that has a 50% duty cycle regardless of the duty cycle of the timing signal PWM. The signals CLK_REF/2 and PWM/2 may be provided as inputs to the exclusive-or gate 204. The output ERR of the exclusive-or gate 204 may be a logical exclusive-or of the signals CLK_REF/2 and PWM/2. The exclusive-or gate 204 responds to both rising and falling edges at its inputs. The divide-by-2 circuit 206 effectively locks the rising edge of the timing signal PWM to the rising edge of the clock reference signal CLK_REF, as explained above. The exclusive-or implementation can only provide uni-directional (i.e., increasing) frequency locking based on error signal ERR. The free running switching frequency (or unlocked frequency) is nominally set to be lower than clock reference frequency. Then the exclusive-or phase detector increases the switching frequency to lock with clock reference frequency CLK_REF. FIG. 3 illustrates detail of the phase detector 108 of FIG. 1 according to other embodiments of the present disclosure. Referring to FIG. 3, the phase detector 108 may include two D flip-flops 302A, 302B, and an AND gate 304. Each of the flip-flops may receive a logic "1" as the D input. The flip-flop 302A may be clocked by the clock reference signal CLK_REF, while the flip flop 302B may be clocked by the timing signal PWM. The Q output of the flip-flop 302A is an error signal UP. The Q output of the flip-flop 302B is an error signal DOWN. The error signals UP and DOWN may be provided as inputs to the AND gate 304. The output of the AND gate 304 may be a logical AND of the error signals UP and DOWN. The output of the AND gate 304 may be provided to the flip-flops 302A and 302B as reset signals.

Figure 4:
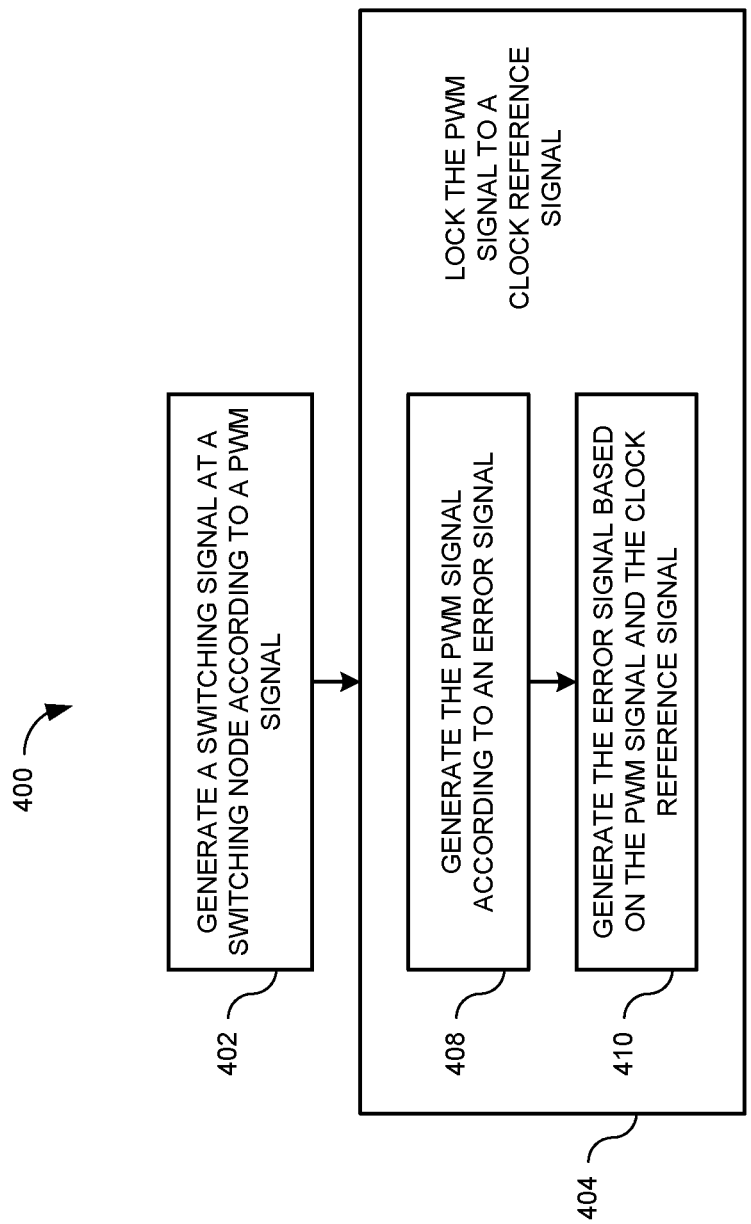
FIG. 4 illustrates a process for the switching voltage regulator of FIG. 1 according to embodiments of the present disclosure.

FIG. 4 illustrates a process 400 for the switching voltage regulator 100 of FIG. 1 according to embodiments of the present disclosure. Referring to FIG. 4, the voltage regulator 100 may generate a switching signal at a switching node according to a pulse-width modulated (PWM) signal, at 402. For example, referring to FIG. 1, the driver 106 of the switching circuit 102 may operate the switches S1 and S2 in accordance with the timing signal PWM to generate the switching signal at the switching node SN. The switching circuit 102 may set on-times of the switching signal according to pulse widths of the timing signal PWM.

Referring again to FIG. 4, the switching voltage regulator 100 may lock the PWM signal to a clock reference signal, at 404. For example, referring again to FIG. 1, the PLL 104 may lock the timing signal PWM to the clock reference signal CLK_REF, for example as follows.

Referring again to FIG. 4, the switching voltage regulator 100 may generate the PWM signal according to an error signal, at 408. For example, referring again to FIG. 1, the PWM circuit 110 may generate the timing signal PWM in accordance with an error signal ERR. In some embodiments, the PWM circuit 110 may generate the timing signal PWM based on one or both of a voltage VSN of the switching node SN, and an output voltage VOUT of the output node OUTN.

Referring again to FIG. 4, the switching voltage regulator 100 may generate the error signal based on the PWM signal and the clock reference signal, at 410. Referring to FIG. 1, the phase detector 108 may generate the error signal ERR based on the timing signal PWM and the clock reference signal CLK_REF. For example, the phase detector 108 may generate the error signal ERR based on a phase difference between the timing signal PWM and the clock reference signal CLK_REF.

In some cases, the phase difference between the timing signal PWM in the clock reference signal CLK_REF may become so great that it is outside a lock range of the PLL 104. To handle these cases, some embodiments include a lock range extension feature.

Figure 5:
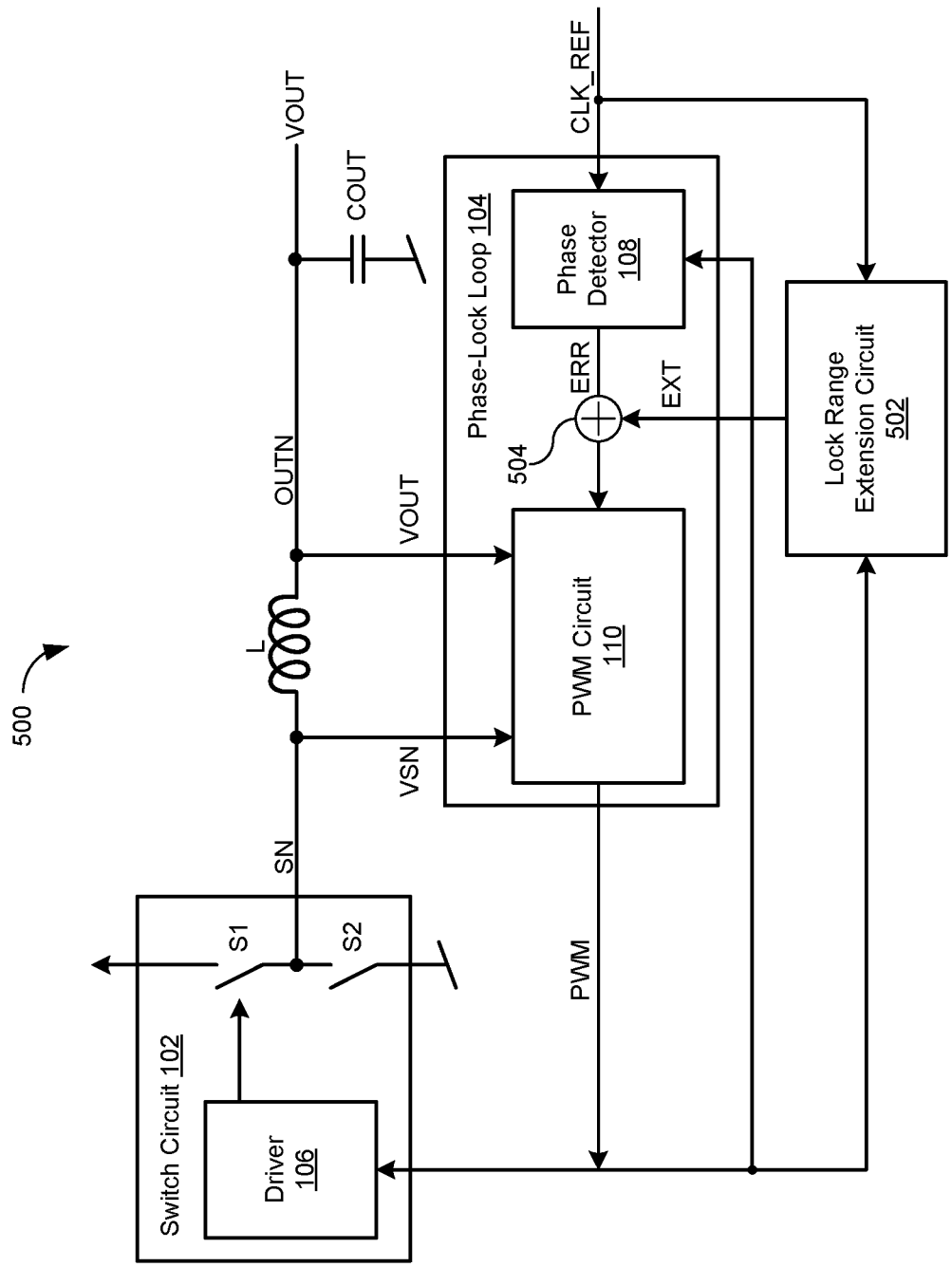
FIG. 5 illustrates a switching voltage regulator that includes the switching voltage regulator of FIG. 1 and a lock range extension feature according to embodiments of the present disclosure.

FIG. 5 illustrates a switching voltage regulator 500 that includes the switching voltage regulator 100 of FIG. 1 and a lock range extension feature according to some embodiments of the present disclosure. Referring to FIG. 5, the switching voltage regulator 500 includes the components of the switching voltage regulator 100 of FIG. 1. The switching voltage regulator 500 FIG. 5 may also include a lock range extension circuit 502. The lock range extension circuit 502 may generate a lock range extension signal EXT based on the timing signal PWM and the clock reference signal CLK_REF.

The PLL 104 of the switching voltage regulator 500 of FIG. 5 may include a summer 504. The summer 504 may generate a sum of the lock range extension signal EXT generated by the lock range extension circuit 502 and the error signal ERR generated by the phase detector 108. The summer 504 may provide that sum to the PWM circuit 110. The PWM circuit 110 may generate the timing signal PWM according to that sum.

Figure 6:
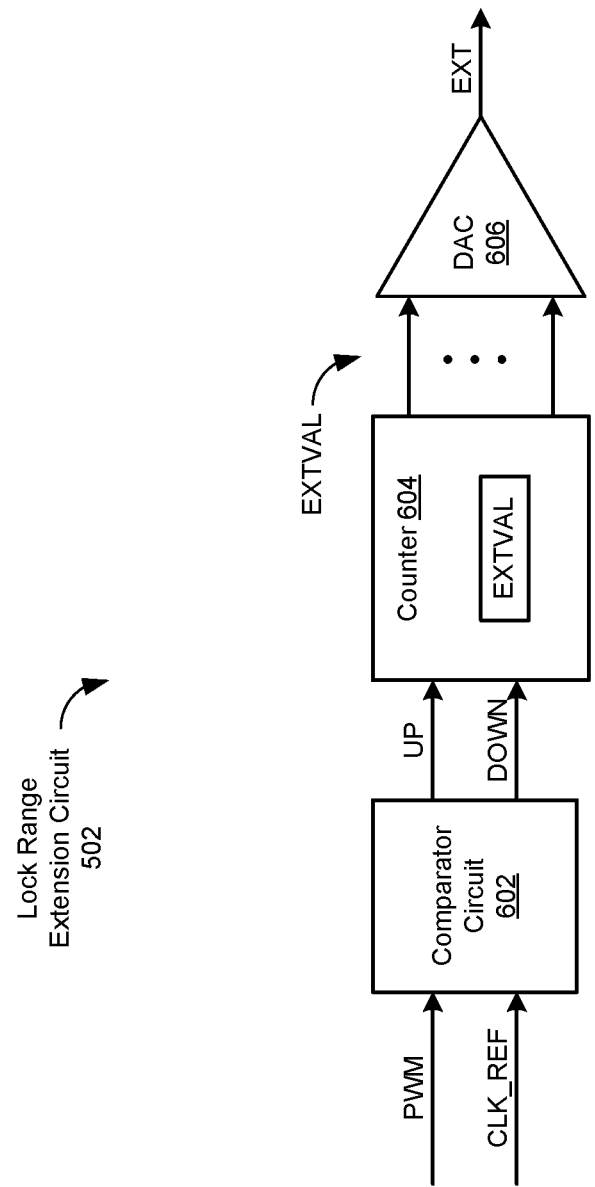
FIG. 6 illustrates detail of the lock range extension circuit of the switching voltage regulator of FIG. 5 according to embodiments of the present disclosure.

FIG. 6 illustrates detail of the lock range extension circuit 502 of the switching voltage regulator 500 of FIG. 5 according to some embodiments of the present disclosure. Referring to FIG. 6, the lock range extension circuit 502 may include a comparator circuit 602. The comparator circuit 602 may generate a pair of signals UP and DOWN based on the timing signal PWM and the clock reference signal CLK_REF.

The lock range extension circuit 502 may include a counter 604. The counter 604 may store an extension value EXTVAL. Responsive to the signals UP and DOWN provided by the comparator circuit 602, the counter 604 may modify the extension value EXTVAL. For example, responsive to assertion of the UP signal, the counter 604 may increment the extension value EXTVAL. Similarly, responsive to assertion of the DOWN signal, the counter 604 may decrement the extension value EXTVAL.

The lock range extension circuit 502 may include a digital-to-analog converter (DAC) 606. The counter 604 may provide the extension value EXTVAL to the DAC 606. The DAC 606 may provide the extension signal EXT as an analog representation of the extension value EXTVAL.

Figure 7:
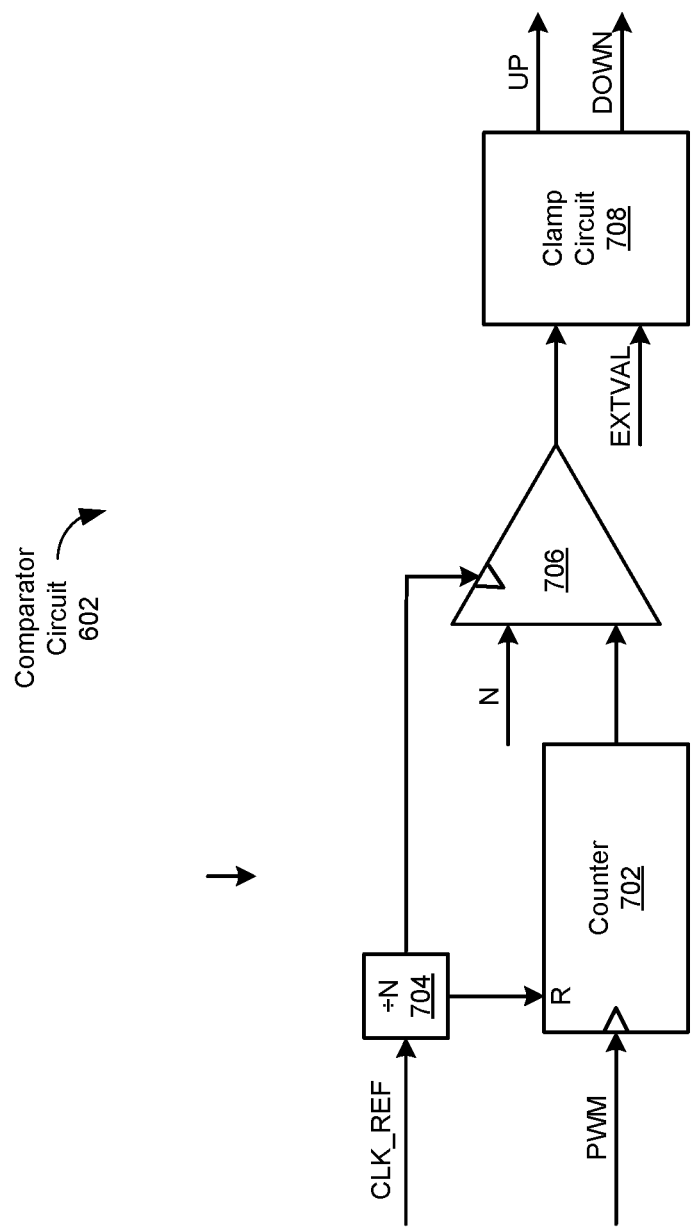
FIG. 7 illustrates detail of the comparator circuit of FIG. 6 according to embodiments of the present disclosure.

FIG. 7 illustrates detail of the comparator circuit 602 of FIG. 6 according to embodiments of the present disclosure. Referring to FIG. 7, the comparator circuit 602 may include a counter 702. The counter 702 may be clocked by the timing signal PWM. For example, the counter 702 may increment the stored value with each rising edge of the timing signal PWM.

The comparator circuit 602 may include a divide-by-N circuit 704. The divide-by-N circuit 704 may provide an output signal every N cycles of the clock reference signal CLK_REF. Responsive to receiving the output signal of the divide-by-N circuit 704, the counter 702 may reset. In this manner, the counter 702 may be reset every N cycles of the clock reference signal CLK_REF. In this manner, the counter 702 may count pulses of the timing signal PWM over a predetermined number N of clock cycles of the clock reference signal CLK_REF.

The comparator circuit 602 may include a comparator 706. The comparator 706 may compare the output of the counter 702 with the predetermined number N. The comparator 706 may be enabled by the output signal of the divide-by-N circuit 704. In this manner, the comparator 706 may modify the extension value EXTVAL based on the number of pulses of the timing signal PWM occurring during the predetermined number N of cycles of the clock reference signal CLK_REF.

The comparator circuit 602 may include a clamp circuit 708. The clamp circuit 708 may receive the output of the comparator 706, and the extension value EXTVAL. The clamp circuit 708 may prevent rollover of the DAC 606 of the lock range extension circuit 502 of FIG. 6. For example, when the extension value EXTVAL is equal to a maximum value supported by the DAC 606, the clamp circuit 708 may prevent the UP signal from being asserted. Similarly, when the extension value EXTVAL is equal to a minimum value supported by the DAC 606, the clamp circuit 708 may prevent the DOWN signal from being asserted.

Figure 8:
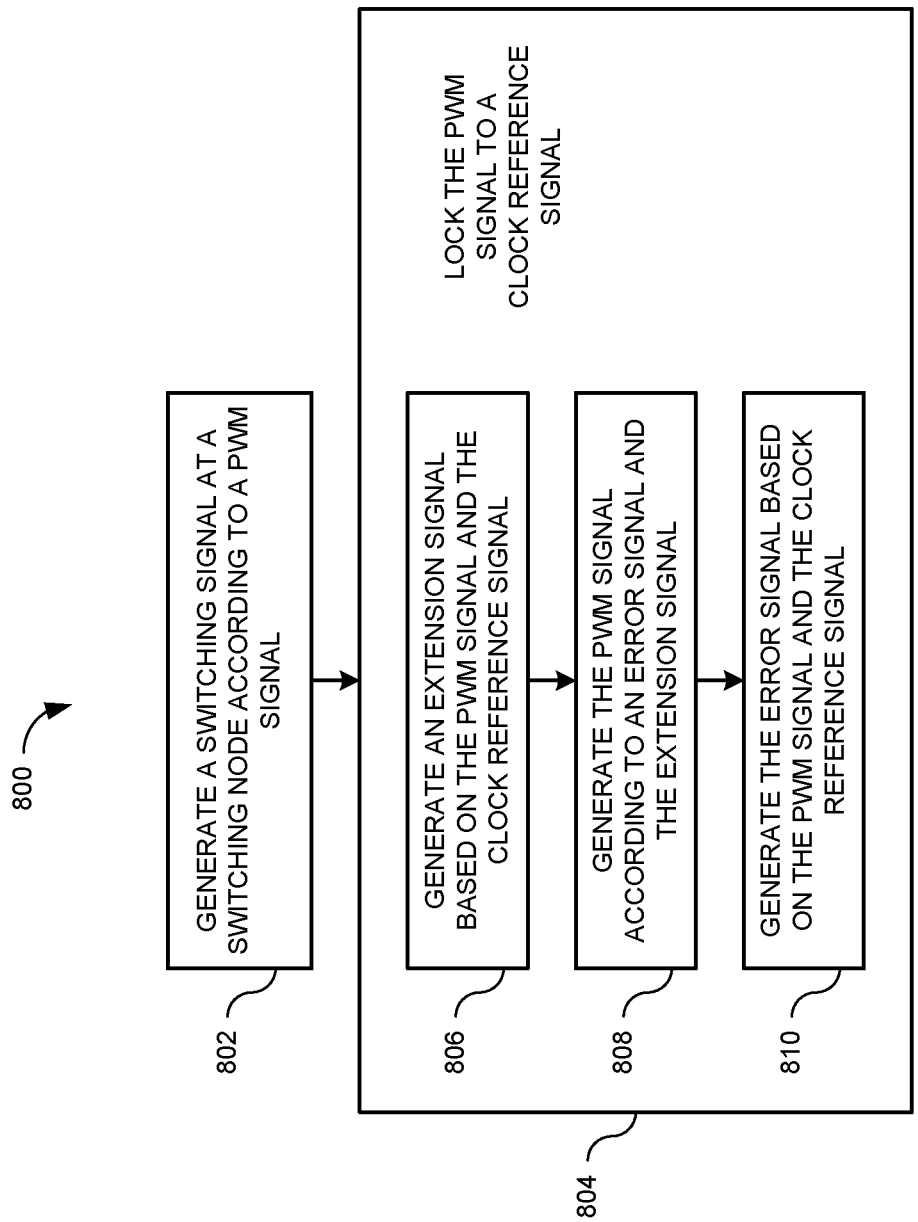
FIG. 8 illustrates a process for the switching voltage regulator of FIG. 5 according to embodiments of the present disclosure.

FIG. 8 illustrates a process 800 for the switching voltage regulator 500 of FIG. 5 according to embodiments of the disclosed technology. Referring to FIG. 8, the voltage regulator 500 may generate a switching signal at a switching node according to a pulse-width modulated (PWM) signal, at 802. For example, referring to FIG. 5, the driver 106 of the switching circuit 102 may operate the switches S1 and S2 in accordance with the timing signal PWM to generate the switching signal at the switching node SN. The switching circuit 102 may set on-times of the switching signal according to pulse widths of the timing signal PWM.

Referring again to FIG. 8, the switching voltage regulator 500 may lock the PWM signal to a clock reference signal, at 804. For example, referring again to FIG. 5, the PLL 104 may lock the timing signal PWM to the clock reference signal CLK_REF, for example as follows.

Referring again to FIG. 8, the switching voltage regulator 500 may generate an extension signal EXT based on the PWM signal and the clock reference signal, at 806. Referring to FIG. 5, the lock range extension circuit 502 may generate the error signal ERR based on the timing signal PWM and the clock reference signal CLK_REF. For example, the phase detector 108 may generate the extension signal EXT based on the number of pulses of the timing signal PWM occurring during a predetermined number of cycles of the clock reference signal CLK_REF.

Referring again to FIG. 8, the switching voltage regulator 500 may generate the PWM signal according to an error signal and an extension signal, at 808. For example, referring again to FIG. 5, the PWM circuit 110 may generate the timing signal PWM in accordance with the error signal ERR and the extension signal EXT. In some embodiments, the PWM circuit 110 may generate the timing signal PWM based on one or both of a voltage VSN of the switching node SN, and an output voltage VOUT of the output node OUTN.

Referring again to FIG. 8, the switching voltage regulator 500 may generate the error signal based on the PWM signal and the clock reference signal, at 810. For example, referring again to FIG. 5, the phase detector 108 may generate the error signal ERR based on the timing signal PWM and the clock reference signal CLK_REF. For example, the phase detector 108 may generate the error signal ERR based on a phase difference between the timing signal PWM and the clock reference signal CLK_REF.

Embodiments of the present disclosure provides several advantages over conventional approaches. In particular, the disclosed regulators feature PLLs that lock the switching frequency of the regulators to reference clock signals. Therefore the switching frequencies of the disclosed regulators may be controlled by controlling the frequencies reference clock signals. These techniques thereby provide switching voltage regulators having stable switching frequencies.

Furthermore, some embodiments provide a PLL lock range extensions feature. This feature extends the lock range of the disclosed PLLs. Therefore the disclosed regulators may lock their timing signals to the clock reference signals even outside the lock range of the PLLs.

Spatially relative terms such as "under," "below," "lower," "over," "upper," and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising," and the like are open ended terms that indicate the presence of stated elements or features, but do not preclude additional elements or features. The articles "a," "an" and "the" are intended to include the plural as well as the singular, unless the context clearly indicates otherwise.

Although this invention has been disclosed in the context of certain implementations and examples, it will be understood by those skilled in the art that the present invention extends beyond the specifically disclosed implementations to other alternative implementations and/or uses of the invention and obvious modifications and equivalents thereof. Thus, it is intended that the scope of the present invention herein disclosed should not be limited by the particular disclosed implementations described above.

Furthermore, the skilled artisan will recognize the interchangeability of various features from different implementations. In addition to the variations described herein, other known equivalents for each feature can be mixed and matched by one of ordinary skill in this art to construct analogous systems and techniques in accordance with principles of the present invention.

It is to be understood that not necessarily all objects or advantages may be achieved in accordance with any particular implementation of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

What is claimed is:

1. An adaptive on-time switching voltage regulator comprising:
    a switching circuit configured to generate a switching signal at a switching node according to a pulse-width modulated (PWM) signal;
    a phase-lock loop (PLL) configured to lock the PWM signal to a clock reference signal, the PLL comprising:
        a PWM signal generator configured to generate the PWM signal according to an error signal, and
        a phase detector configured to generate the error signal based on the PWM signal and the clock reference signal; and
    a lock range extension circuit configured to generate an extension signal based on the PWM signal and the clock reference signal;
    wherein the PWM signal generator is further configured to generate the PWM signal according to the error signal and the extension signal.

2. The switching voltage regulator of claim 1, wherein the phase detector is further configured to generate the error signal based on a phase difference between the PWM signal and a clock reference signal.

3. The switching voltage regulator of claim 1, wherein:
    the switching circuit is further configured to set an on-time of the switching signal according to a pulse width of the PWM signal.

4. The switching voltage regulator of claim 1, further comprising:
    an inductor coupled between the switching node and an output node; and
    a capacitor coupled between the output node and ground.

5. The switching voltage regulator of claim 1, wherein the switching circuit comprises:
    a first switch coupled between a power input and the switching node;
    a second switch coupled between ground and the switching node; and
    a driver configured to operate the first and second switches according to the PWM signal.

6. The switching voltage regulator of claim 1, further comprising:
    a summer configured to generate a sum of the error signal and the extension signal;
    wherein the PWM signal generator is further configured to generate the PWM signal according to the sum of the error signal and the extension signal.

7. The switching voltage regulator of claim 1, wherein the lock range extension circuit comprises:
    a counter configured to store an extension value;
    a digital-to-analog converter configured to provide the extension signal based on the extension value stored in the counter; and
    a comparator circuit configured to modify the extension value based on a number of pulses of the PWM signal that occur over a predetermined number of cycles of the clock reference signal.

8. The switching voltage regulator of claim 7, wherein the comparator circuit comprises:
    a further counter configured to count pulses of the PWM signal over a predetermined number of clock cycles of the clock reference signal; and
    a comparator configured to modify the extension value based on counted pulses of the PWM signal and the predetermined number of cycles of the clock reference signal.

9. The switching voltage regulator of claim 8, wherein the comparator circuit further comprises:
    a pause circuit configured to pause operation of the comparator circuit for a determined number of cycles of the reference clock signal after occurrence of the predetermined number of clock cycles of the clock reference signal.

10. The switching voltage regulator of claim 9, wherein the comparator circuit further comprises:
    a clamp circuit configured to prevent rollover of the digital-to-analog converter.

11. A method for a switching voltage regulator, the method comprising:
    generating a switching signal at a switching node according to a pulse-width modulated (PWM) signal;
    locking the PWM signal to a clock reference signal, comprising:

generating the PWM signal according to an error signal, and generating the error signal based on the PWM signal and the clock reference signal;

generating an extension signal based on the PWM signal and the clock reference signal; and generating the PWM signal according to the error signal and the extension signal.

12. The method of claim 11, further comprising:
generating the error signal based on a phase difference between the PWM signal and a clock reference signal.

13. The method of claim 11, further comprising:
setting an on-time of the switching signal according to a pulse width of the PWM signal.

14. The method of claim 11, further comprising:
operating at least one switch according to the PWM signal.

15. The method of claim 11, further comprising:
generating a sum of the error signal and the extension signal; and generating the PWM signal according to the sum of the error signal and the extension signal.

16. The method of claim 11, further comprising:
providing the extension signal based on an extension value; and modifying the extension value based on a number of pulses of the PWM signal that occur over a predetermined number of cycles of the clock reference signal.

17. The method of claim 16, further comprising:
counting pulses of the PWM signal over a predetermined number of clock cycles of the clock reference signal; and modifying the extension value based on counted pulses of the PWM signal and the predetermined number of cycles of the clock reference signal.

18. The method of claim 17, further comprising:
pausing operation of the comparator circuit for a determined number of cycles of the reference clock signal after occurrence of the predetermined number of clock cycles of the clock reference signal.

\* \* \* \* \*